(12) United States Patent
Hashi

(10) Patent No.: US 9,635,769 B2
(45) Date of Patent: Apr. 25, 2017

(54) ELECTRONIC DEVICE, ELECTRONIC APPARATUS, METHOD OF MANUFACTURING BASE SUBSTRATE, AND METHOD OF MANUFACTURING ELECTRONIC DEVICE

(71) Applicant: Seiko Epson Corporation, Tokyo (JP)

(72) Inventor: Yukihiro Hashi, Shiojiri (JP)

(73) Assignee: Seiko Epson Corporation (JP)

( * ) Notice: Subject to any disclaimer, the term of this patent is extended or adjusted under 35 U.S.C. 154(b) by 154 days.

(21) Appl. No.: 13/858,279

(22) Filed: Apr. 8, 2013

(65) Prior Publication Data

US 2013/0306367 A1 Nov. 21, 2013

(30) Foreign Application Priority Data

Apr. 10, 2012 (JP) ................. 2012-089664

(51) Int. Cl.
| | |
|---|---|
| H05K 5/00 | (2006.01) |
| H05K 3/10 | (2006.01) |
| H05K 1/11 | (2006.01) |
| H05K 1/18 | (2006.01) |
| H05K 3/34 | (2006.01) |
| H05K 1/02 | (2006.01) |
| H05K 3/24 | (2006.01) |
| H05K 3/32 | (2006.01) |

(52) U.S. Cl.
CPC ........... *H05K 5/0091* (2013.01); *H05K 1/111* (2013.01); *H05K 1/183* (2013.01); *H05K 3/10* (2013.01); *H05K 3/108* (2013.01); *H05K 3/3494* (2013.01); *H05K 1/0284* (2013.01); *H05K 3/243* (2013.01); *H05K 3/321* (2013.01); *H05K 2201/10083* (2013.01); *H05K 2201/10371* (2013.01); *H05K 2203/107* (2013.01); *Y02P 70/611* (2015.11); *Y10T 29/49155* (2015.01)

(58) Field of Classification Search
CPC .............. H05K 5/0091; H05K 5/06; H05K 2203/0703; H05K 5/0052
USPC ............. 361/752, 736; 257/704, 779–781
See application file for complete search history.

(56) References Cited

U.S. PATENT DOCUMENTS

| | | | | |
|---|---|---|---|---|
| 6,661,090 B1 * | 12/2003 | Leung | ................ | H01L 23/10 257/678 |
| 6,759,590 B2 * | 7/2004 | Stark | ................ | 174/539 |
| 6,924,429 B2 * | 8/2005 | Kasai | ................ | B32B 18/00 174/565 |
| 7,449,773 B2 * | 11/2008 | Tarn | ................ | 257/700 |

(Continued)

FOREIGN PATENT DOCUMENTS

| | | |
|---|---|---|
| JP | 11-354660 A | 12/1999 |
| JP | 2000-134055 A | 5/2000 |

(Continued)

*Primary Examiner* — Courtney Smith
*Assistant Examiner* — Jessey R Ervin
(74) *Attorney, Agent, or Firm* — Harness, Dickey & Pierce, P.L.C.

(57) ABSTRACT

An electronic device has a package and a piezoelectric element accommodated in an accommodating space formed inside the package. The package has a frame-like metallization layer bonding a base substrate and a lid together and electrodes formed on and in the base substrate and electrically connected with the piezoelectric element. The metallization layer is insulated from the electrodes.

6 Claims, 11 Drawing Sheets

(56) References Cited

U.S. PATENT DOCUMENTS

| | | | |
|---|---|---|---|
| 7,518,205 B2* | 4/2009 | Suzuki | H01L 21/50 257/432 |
| 7,675,162 B2* | 3/2010 | Foster et al. | 257/704 |
| 2003/0070292 A1* | 4/2003 | Tatoh | H01L 23/15 29/846 |
| 2003/0104651 A1* | 6/2003 | Kim | B81C 1/00269 438/106 |
| 2004/0207071 A1 | 10/2004 | Shiomi et al. | |
| 2006/0197215 A1* | 9/2006 | Potter | B81C 1/00269 257/704 |
| 2007/0041164 A1* | 2/2007 | Greenberg et al. | 361/752 |
| 2007/0069394 A1* | 3/2007 | Bachman | H01L 24/03 257/780 |
| 2009/0001856 A1* | 1/2009 | Hara | H03H 9/0595 310/348 |
| 2010/0180415 A1 | 7/2010 | Hara et al. | |
| 2010/0290201 A1* | 11/2010 | Takeuchi | H01L 23/055 361/752 |
| 2011/0174533 A1 | 7/2011 | Nagano | |
| 2011/0221535 A1 | 9/2011 | Sakaba et al. | |
| 2011/0227661 A1 | 9/2011 | Numata et al. | |

FOREIGN PATENT DOCUMENTS

| | | |
|---|---|---|
| JP | 2002-100694 A | 4/2002 |
| JP | 2003-209197 A | 7/2003 |
| JP | 2004-186428 A | 7/2004 |
| JP | 2004-289470 A | 10/2004 |
| JP | 2005-050875 A | 2/2005 |
| JP | 2005-216932 A | 8/2005 |
| JP | 2006-080380 A | 3/2006 |
| JP | 2006-086585 A | 3/2006 |
| JP | 2006157504 A | 6/2006 |
| JP | 2007318209 A | 12/2007 |
| JP | 2009-010717 A | 1/2009 |
| JP | 2009-260845 A | 11/2009 |
| JP | 2011-147054 A | 7/2011 |
| JP | 2011-211681 A | 10/2011 |
| JP | 2012-009967 A | 1/2012 |
| JP | 2012-015779 A | 1/2012 |
| WO | WO-2006098233 A1 | 9/2006 |

* cited by examiner

ELECTRONIC DEVICE, ELECTRONIC APPARATUS, METHOD OF MANUFACTURING BASE SUBSTRATE, AND METHOD OF MANUFACTURING ELECTRONIC DEVICE

BACKGROUND

1. Technical Field

The present invention relates to an electronic device, an electronic apparatus, a method of manufacturing a base substrate, and a method of manufacturing an electronic device.

2. Related Art

In the related art, electronic devices having an electronic component such as a piezoelectric element accommodated in a package have been known. Moreover, as the package, a configuration having abase substrate and a lid (lid portion) bonded together via a bonding member has been known (for example, refer to JP-A-2011-211681 (Patent Document 1)).

The electronic device disclosed in Patent Document 1 has a base substrate, a piezoelectric element fixed to the base substrate, and a lid bonded to the base substrate so as to cover the piezoelectric element. Moreover, an insulating layer and an insulating adhesive are present between the base substrate and the lid. With the insulating layer and the insulating adhesive, the lid is bonded to the base substrate.

Here, as a method of bonding the base substrate with the lid, a method has also been known, in addition to the method of using an insulating adhesive like in Patent Document 1, in which a metal layer (metallization layer) is allowed to be present between the base substrate and the lid, and the metal layer is heated and melted by laser irradiation to thereby bond them together (so-called laser sealing).

The laser sealing is an excellent method, compared to other methods, from the viewpoints of bonding accuracy, bonding strength, and the like, but cannot be applied to the piezoelectric element of Patent Document 1 having no metallization layer. Moreover, if a metallization layer is disposed, instead of the insulating layer and the insulating adhesive, in the electronic device of Patent Document 1 for applying the laser sealing, the metallization layer overlaps with and is connected to a lead terminal that connects a connection electrode (quartz crystal holding terminal) formed on an upper surface of the base substrate with a mounting terminal formed on a lower surface of the base substrate. Therefore, in laser sealing, heat applied to the metallization layer escapes to the outside of the metallization layer via the lead terminal. Therefore, variation in temperature is generated in the metallization layer, along with which variation in bonding strength between the lid and the base substrate is generated.

SUMMARY

An advantage of some aspects of the invention is to provide an electronic device in which the escape of heat from a metallization layer can be suppressed, variation in temperature in the metallization layer in heating can be suppressed, and a lid portion and a base substrate can be bonded together at a more uniform bonding strength, an electronic apparatus having high reliability, a method of manufacturing a base substrate having high reliability, and a method of manufacturing an electronic device having high reliability.

The invention can be implemented as the following modes or application examples.

Application Example 1

This application example of the invention is directed to an electronic device including: an electronic component; a base substrate to which the electronic component is fixed; a lid portion accommodating the electronic component in a space formed together with the base substrate; a frame-like metallization layer formed above the base substrate and bonding the base substrate and the lid portion together; and an electrode formed above the base substrate, wherein the metallization layer and the electrode are insulated from each other.

For example, as a method of bonding the lid portion to the base substrate, a method has been known in which the lid portion is placed above the base substrate, and the metallization layer is irradiated with a laser from the lid portion side, and the metallization layer is heated and melted to thereby bond them together (laser sealing). The metallization layer is formed above the base substrate spaced apart from the electrode, that is, independently (thermally independent) like the application example of the invention, whereby in heating of the metallization layer by irradiation with a laser, the heat can be efficiently confined in the metallization layer, so that it is possible to suppress the escape of the heat of the laser to the outside via the electrode. Therefore, the heat of the laser can be efficiently used for heating the metallization layer, so that the lid portion can be bonded more reliably to the base substrate.

Moreover, it is possible to suppress variation in temperature in the metallization layer in heating, so that the bonding can be performed evenly (that is, uniformly) over the entire region of the metallization layer in its circumferential direction. Therefore, the bonding strength between the lid portion and the base substrate can be increased, and the airtightness of an accommodating space can be more enhanced. Moreover, compared to the related art for example, the intensity of a laser can be reduced or the irradiation time of a laser can be shortened, so that damage done to the metallization layer can be reduced.

Application Example 2

In the electronic device according to the application example of the invention, it is preferable that the metallization layer has a plurality of metal layers stacked above the base substrate, and that in plan view, the width of the metal layer closest to the base substrate side is smaller than the width of at least one of the other metal layers.

With this configuration, the contact area between the metallization layer and the base substrate can be made small, so that the escape of heat from the metallization layer to the base substrate can be effectively suppressed.

Application Example 3

In the electronic device according to the application example of the invention, it is preferable that at least one of the plurality of metal layers includes a material containing as a main component at least one of gold, silver, and copper.

In this manner, since the metallization layer includes the metal layer having a relatively high thermal conductivity, the heat of a laser can be confined more efficiently and evenly in the metallization layer, so that the heating and melting of the metallization layer can be effectively performed.

Application Example 4

In the electronic device according to the application example of the invention, it is preferable that the metal layer of the plurality of metal layers, which is closest to the base substrate side, includes a material containing as a main component at least one of Cr, a Ti—W-based alloy, and a Ni—Cr-based alloy.

With this configuration, the escape of heat from the metallization layer to the base substrate can be effectively suppressed. Therefore, the heat of a laser can be confined more efficiently in the metallization layer, so that the heating and melting of the metallization layer can be effectively performed.

Application Example 5

In the electronic device according to the application example of the invention, it is preferable that the electrode has a through-electrode penetrating the base substrate and spaced apart from the metallization layer by 150 µm or more.

With this configuration, the escape of heat of the metallization layer via the through-electrode can be effectively suppressed.

Application Example 6

This application example of the invention is directed to an electronic apparatus including the electronic device according to the application example of the invention.

With this configuration, the electronic apparatus having high reliability is obtained.

Application Example 7

This application example of the invention is directed to a method of manufacturing a base substrate including an electrode formed on one of surfaces, an electrode formed on the other surface and electrically connected with the electrode on the one surface, and a metallization layer formed on the one surface and arranged so as to be insulated from the electrode on the one surface and surround the electrode on the one surface. The method includes: simultaneously forming the electrode on the one surface and the metallization layer by plating.

With this configuration, the base substrate having high reliability can be easily manufactured.

Application Example 8

This application example of the invention is directed to a method of manufacturing an electronic device including: preparing a lid made of a metal and a base substrate including an electrode formed on one of surfaces, an electrode formed on the other surface and electrically connected with the electrode on the one surface, and a metallization layer formed on the one surface and arranged so as to be insulated from the electrode on the one surface and surround the electrode on the one surface; and bonding the lid and the base substrate together by irradiation with an energy beam.

With this configuration, the electronic device having high reliability can be easily manufactured.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, an electronic device, an electronic apparatus, a method of manufacturing a base substrate, and a method of manufacturing the electronic device of the invention will be described in detail based on preferred embodiments shown in the accompanying drawings.

First Embodiment

Figure 1:
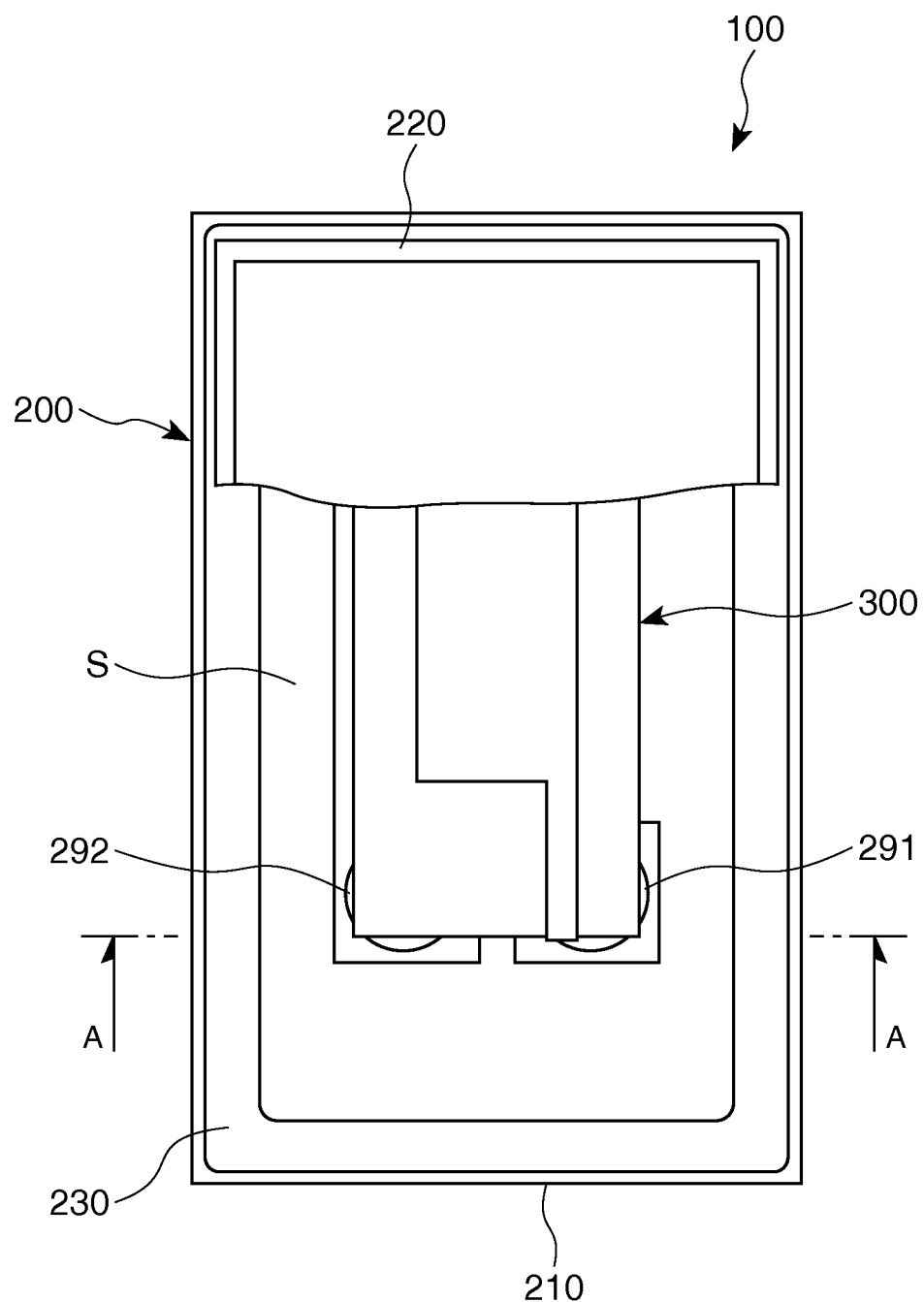
FIG. 1 is a plan view of an electronic device according to a first embodiment of the invention.
Figure 2:
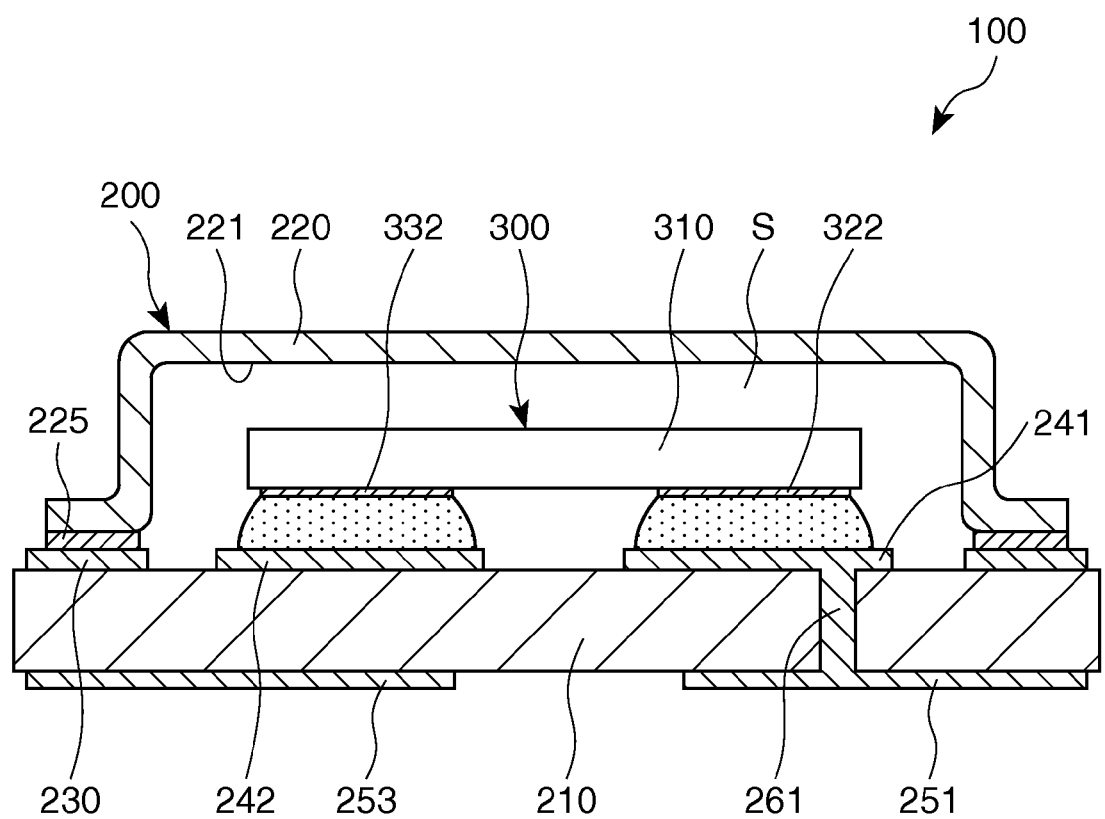
FIG. 2 is a cross-sectional view taken along line A-A of FIG. 1.
Figure 3A:
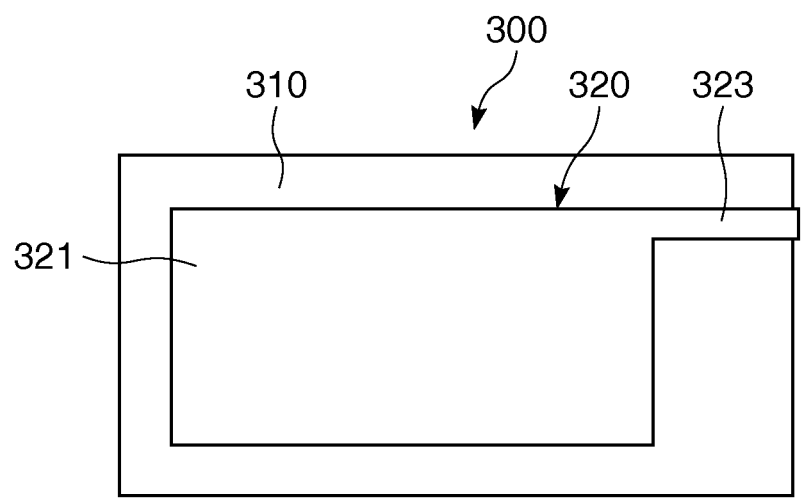
FIGS. 3A and 3B are plan views of a piezoelectric element of the electronic device shown in FIG. 1.
Figure 3B:
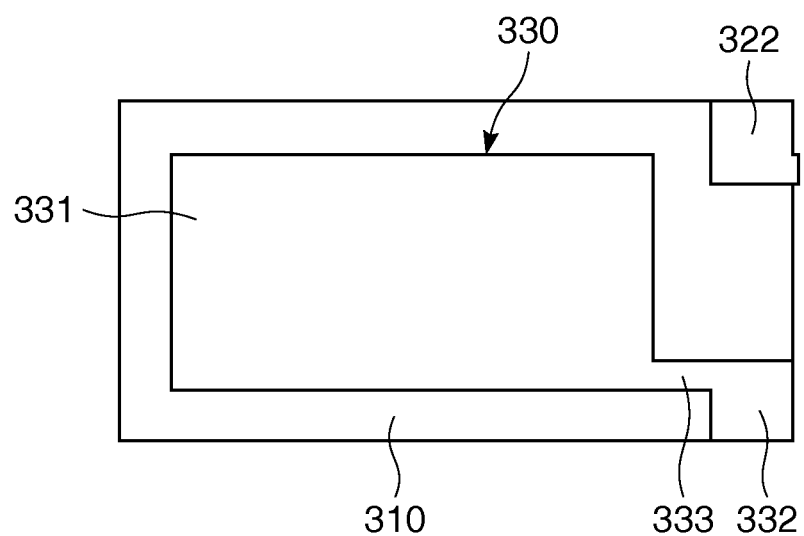
Figure 4:
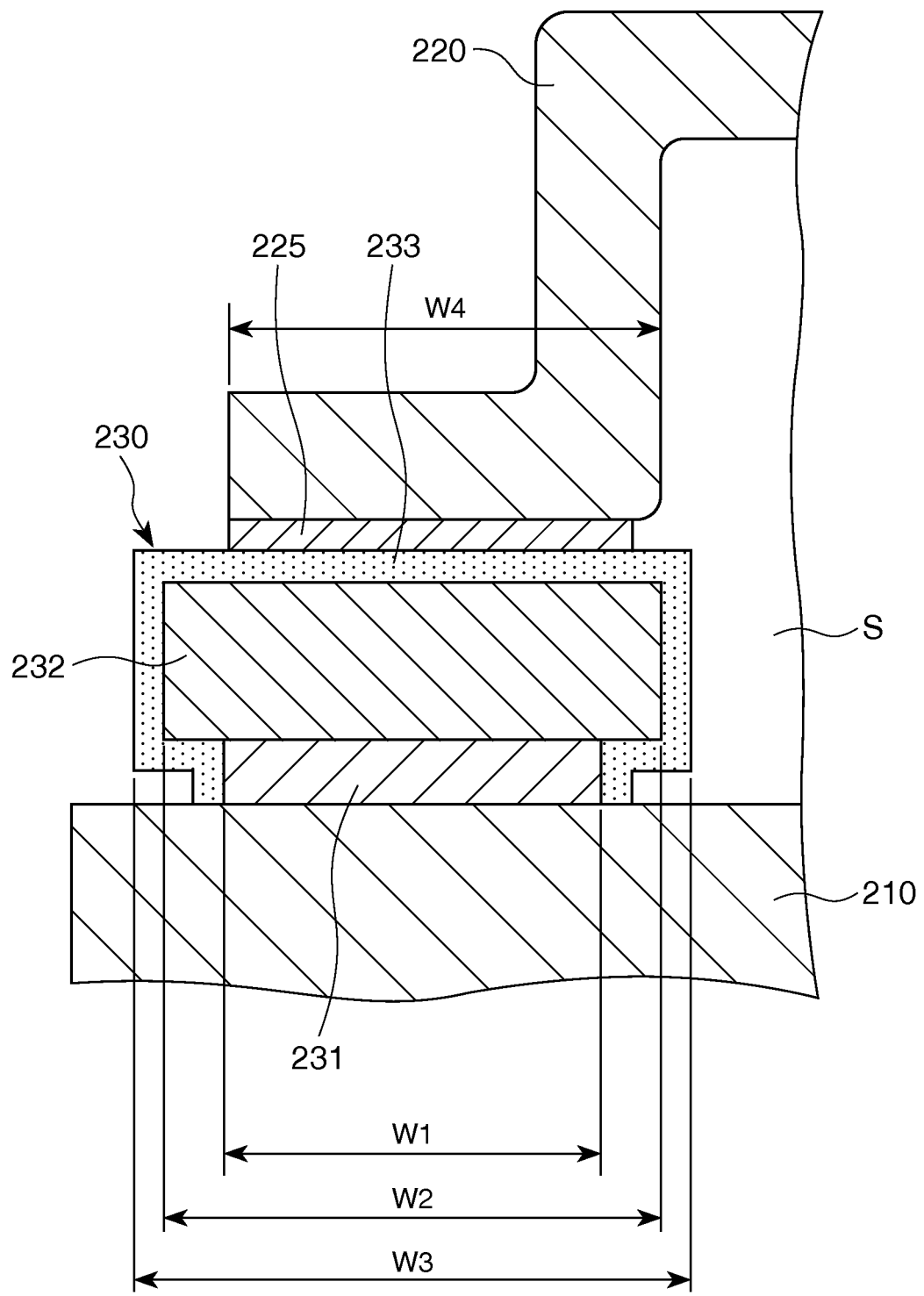
FIG. 4 is a partially magnified cross-sectional view of a metallization layer of the electronic device shown in FIG. 1.
Figure 5:
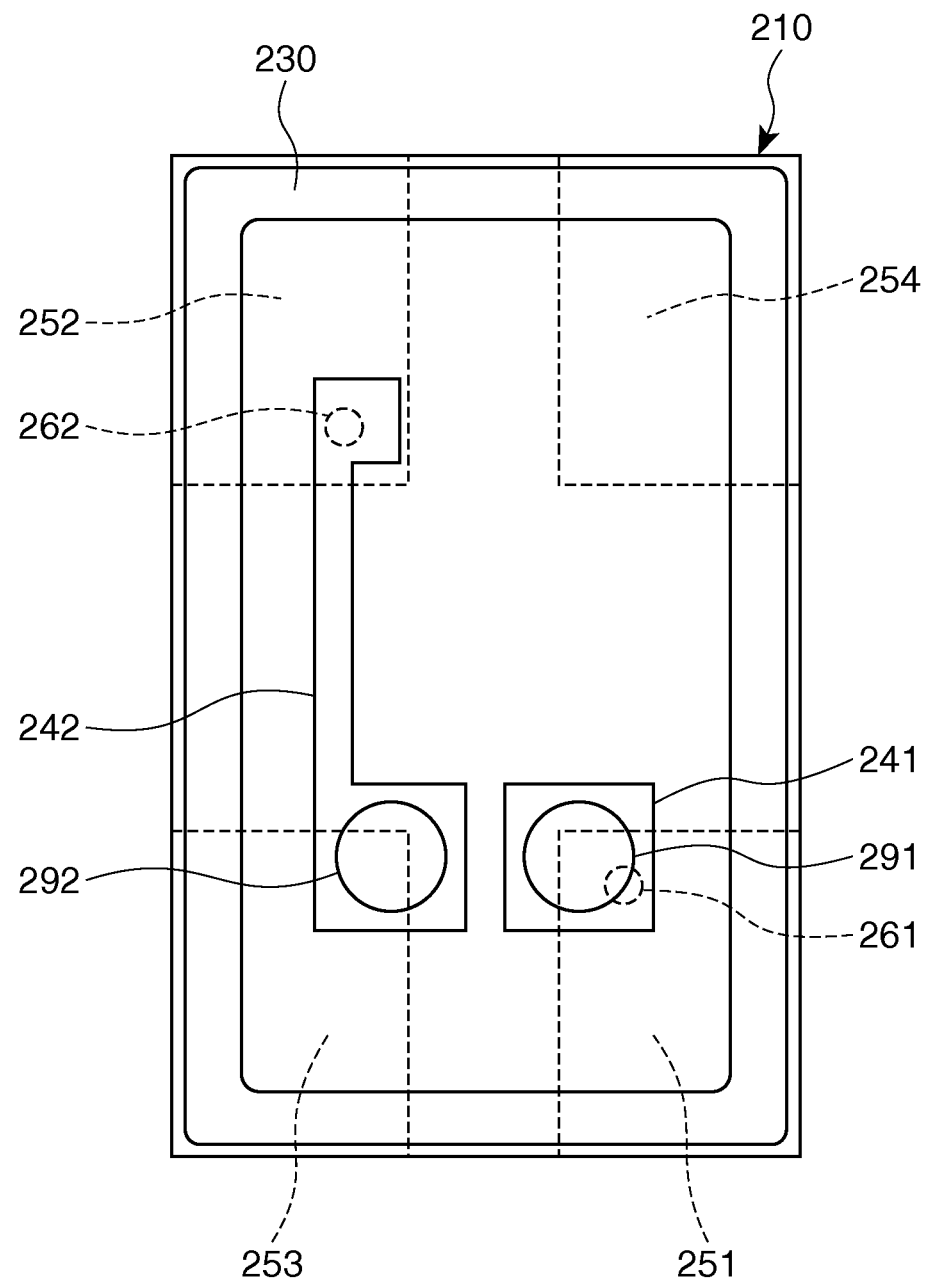
FIG. 5 is a plan view (top view) of a base substrate of the electronic device shown in FIG. 1.

FIG. 1 is a plan view of an electronic device according to a first embodiment of the invention. FIG. 2 is a cross-sectional view taken along line A-A of FIG. 1. FIGS. 3A and 3B are plan views of a piezoelectric element of the electronic device shown in FIG. 1. FIG. 4 is a partially magnified cross-sectional view of a metallization layer of the electronic device shown in FIG. 1. FIG. 5 is a plan view (top view) of a base substrate of the electronic device shown in FIG. 1. FIGS. 6A to 7C explain a method of manufacturing the electronic device shown in FIG. 1. In the following description, the upside in FIGS. 2 and 4 to 7 is defined as "top", and the downside is defined as "bottom" for convenience of description.

1. Electronic Device

First, the electronic device of the embodiment of the invention will be described.

As shown in FIGS. 1 and 2, the electronic device 100 has a package 200 and a piezoelectric element 300 as an electronic component accommodated in an accommodating space S in the package 200.

Piezoelectric Element

FIG. 3A is a plan view of the piezoelectric element 300 as viewed from above. FIG. 3B is a see-through view (plan view) of the piezoelectric element 300 as viewed from above. As shown in FIGS. 3A and 3B, the piezoelectric element 300 has a piezoelectric substrate 310 having an oblong (rectangular) plate-like shape in plan view and a pair of excitation electrodes 320 and 330 formed on surfaces of the piezoelectric substrate 310.

The piezoelectric substrate 310 is a quartz crystal blank that mainly performs thickness-shear vibration. In the embodiment, a quartz crystal blank that is cut at a cut angle called AT-cut is used as the piezoelectric substrate 310. The AT-cut means to cut a quartz crystal blank so as to have a principal surface (principal surface including an X-axis and a Z'-axis) obtained by rotating a plane (Y-plane) including the X-axis and a Z-axis as the crystal axes of quartz crystal about the X-axis in the counterclockwise direction by an angle of about 35 degrees and 15 minutes from the Z-axis.

The longitudinal direction of the piezoelectric substrate 310 having the configuration described above coincides with the X-axis as the crystal axis of quartz crystal.

The excitation electrode 320 has an electrode portion 321 formed on an upper surface of the piezoelectric substrate 310, a bonding pad 322 formed on a lower surface of the piezoelectric substrate 310, and a wiring 323 electrically connecting the electrode portion 321 with the bonding pad 322.

On the other hand, the excitation electrode 330 has an electrode portion 331 formed on the lower surface of the piezoelectric substrate 310, a bonding pad 332 formed on the lower surface of the piezoelectric substrate 310, and a wiring 333 electrically connecting the electrode portion 331 with the bonding pad 332.

The electrode portions 321 and 331 are disposed to face each other via the piezoelectric substrate 310 and have substantially the same shape. That is, in plan view of the piezoelectric substrate 310, the electrode portions 321 and 331 are located so as to overlap with each other and formed so as to coincide in outline with each other. Moreover, the bonding pads 322 and 332 are formed spaced apart from each other at right ends, in FIGS. 3A and 3B, on the lower surface of the piezoelectric substrate 310.

The excitation electrodes 320 and 330 can be formed by, for example, depositing an under layer of nickel (Ni) or chromium (Cr) on the piezoelectric substrate 310 by vapor deposition or sputtering, depositing an electrode layer of gold (Au) on the under layer by vapor deposition or sputtering, and then patterning into a desired shape using photolithography and various kinds of etching techniques. With the formation of the under layer, the adhesiveness between the piezoelectric substrate 310 and the electrode layer is improved, so that the piezoelectric element 300 with high reliability is obtained.

The configurations of the excitation electrodes 320 and 330 are not limited to the configurations described above. For example, the under layer may be omitted, or the constituent material of the excitation electrodes 320 and 330 may be another material having electrical conductivity (for example, various kinds of metal materials such as silver (Ag), copper (Cu), tungsten (W), or molybdenum (Mo)).

The piezoelectric element 300 is fixed to the package 200 via a pair of electrically-conductive adhesives 291 and 292.

Although the piezoelectric element 300 has been described so far, the configuration of the piezoelectric element 300 is not limited to this. For example, the piezoelectric element 300 may be a vibrator, a gyro sensor, or the like having a shape in which a plurality of vibrating arms extend from a base portion.

Package

As shown in FIGS. 1 and 2, the package 200 has a plate-like base substrate 210, a cap-like lid (lid portion) 220 having a recess 221 that is opened on the lower side, and a metallization layer 230 bonding the base substrate 210 with the lid 220. In the package 200, an opening of the recess 221 of the lid 220 is closed by the base substrate 210 to thereby form the accommodating space S.

A brazing material 225 such as silver solder is formed in a frame-shape on an opening edge surface of the recess 221 on a lower surface of the lid 220. The lid 220 is bonded to the metallization layer 230 via the brazing material 225. With this configuration, the lid 220 is bonded to the base substrate 210, and the accommodating space S that is airtight is formed in the package 200. The brazing material 225 may be formed on the entire lower surface of the lid 220.

The constituent material of the base substrate 210 is not particularly limited as long as it has an insulating property, and various kinds of ceramics such as, for example, oxide-based ceramics, nitride-based ceramics, or carbide-based ceramics can be used. Moreover, although not particularly limited, the constituent material of the lid 220 is preferably a member whose linear expansion coefficient approximates that of the constituent material of the base substrate 210. For example, when the ceramics described above are used as the constituent material of the base substrate 210, an alloy such as Kovar is preferably used.

The metallization layer 230 is disposed in a frame-shape along an edge of an upper surface of the base substrate 210. The entire region of the metallization layer 230 is formed on the upper surface of the base substrate 210. For example, the metallization layer 230 does not have a region or the like extending to a side surface of the base substrate 210. Moreover, the metallization layer 230 is not in contact (connected) with any of connection electrodes 241 and 242, mounting electrodes 251, 252, 253, and 254 and through-electrodes 261 and 262 formed on and in the base substrate 210, and does not overlap with the connection electrodes 241 and 242 via another member (for example, an insulating layer or the like) on the upper surface of the base substrate 210. That is, the metallization layer 230 is insulated from any of the connection electrodes 241 and 242, the mounting electrodes 251, 252, 253, and 254, and the through-electrodes 261 and 262 formed on and in the base substrate 210. In this manner, the metallization layer 230 is formed above the base substrate 210 to be independently separated (spaced apart) from the other terminals, electrodes, and the like, whereby the following advantageous effects can be provided.

As will be described also in a manufacturing method described later, as a method of bonding the lid 220 to the base substrate 210, a method (laser sealing) has been known in which in a state of placing the lid 220 above the base substrate 210, the metallization layer 230 is irradiated with a laser from the lid 220 side via the lid 220 to heat and melt the metallization layer 230 and the brazing material 225 to thereby bond the lid 220 to the base substrate 210.

The metallization layer 230 is formed independently (insulatedly) above the base substrate 210 like the package 200, whereby in heating of the metallization layer 230 by irradiation with a laser, the heat can be efficiently confined in the metallization layer 230, so that it is possible to suppress the escape of the heat of the laser to the outside via another member (especially a member whose thermal conductivity is relatively high, such as the connection electrodes 241 and 242, the mounting electrodes 251, 252, 253, and 254, or the through-electrodes 261 and 262). Therefore, the heat of the laser can be efficiently used for heating the metallization layer 230 and the brazing material 225, so that the lid 220 can be bonded more reliably to the base substrate 210.

Moreover, it is possible to suppress variation in temperature in the metallization layer 230 in heating, so that the bonding can be performed evenly over the entire region of the metallization layer 230 in its circumferential direction. Therefore, the bonding strength between the lid 220 and the base substrate 210 is increased, and the airtightness of the accommodating space S is more enhanced. Moreover, for example, the intensity of a laser can be lowered or the irradiation time of a laser can be shortened compared to the related art, so that damage done to the brazing material 225 or the metallization layer 230 can be reduced. Hence, for example, the peeling of the metallization layer 230 from the base substrate 210 can be more effectively prevented, the bonding of the lid 220 to the base substrate 210 can be more reliably performed, and the airtightness of the accommodating space S can be more improved.

As shown in FIG. 4, the metallization layer 230 of the embodiment is composed of a stacked body in which three metal layers are stacked. Specifically, the metallization layer 230 is composed of the stacked body in which a first metal layer (under layer) 231, a second metal layer 232, and a third metal layer (covering layer) 233 are stacked from the base substrate 210 side in this order. The number of metal layers of the metallization layer 230 is not limited to three, and may be one or two, or may be four or more.

The first metal layer 231 of the first to third metal layers 231 to 233 is a layer that mainly suppresses heat transfer from the metallization layer 230 to the base substrate 210, the second metal layer 232 is a layer that is used for bonding with the lid 220, and the third metal layer 233 is a layer that prevents the deterioration (mainly oxidation) of the first and second metal layers 231 and 232 or enhances the wettability of the brazing material 225.

First Metal Layer

It is preferable that the first metal layer 231 of the first to third metal layers 231 to 233, which is located closest to the base substrate 210 side, is composed of a material whose thermal conductivity is lower than that of the constituent material of at least the second metal layer 232 next to (located directly on) the first metal layer 231. It is further preferable that the first metal layer 231 is composed of a material whose thermal conductivity is lower than those of the constituent materials of all the other metal layers (that is, the second and third metal layers 232 and 233). With this configuration, in bonding of the lid 220 to the base substrate 210, the heat of a laser can be effectively kept in the metallization layer 230. That is, it is possible to suppress the escape of the heat of a laser to the base substrate 210 via the first metal layer 231. Therefore, the bonding of the lid 220 to the base substrate 210 can be performed more reliably and efficiently.

Although not particularly limited, the thermal conductivity (thermal conductivity at a normal temperature (about 300K)) of the constituent material of the first metal layer 231 is preferably, for example, about ½ or less of the thermal conductivity of the constituent material of the second metal layer 232 and more preferably about ¼ or less. Specifically, although not particularly limited, the thermal conductivity of the constituent material of the first metal layer 231 is preferably, for example, about 200 $W \cdot m^{-1} \cdot K^{-1}$ or less and more preferably about 100 $W \cdot m^{-1} \cdot K^{-1}$ or less. By adopting the numerical value ranges described above, the advantageous effects described above can be provided more effectively.

Examples of the materials having a relatively low thermal conductivity include, for example, a metal material such as Cr (chromium), Mo (molybdenum), or W (tungsten), or an alloy containing these metal materials (for example, a Ti—W-based alloy or a Ni—Cr-based alloy). Among these, Cr, a Ti—W-based alloy, or a Ni—Cr-based alloy is preferable particularly from the viewpoint of low thermal conductivity.

Moreover, in plan view (in plan view as viewed from the thickness direction of the base substrate 210), it is preferable that a width W1 of the first metal layer 231 is smaller than a width W2 of the second metal layer 232. Specifically, although not particularly limited, it is preferable that a relationship of $0.5W2 \leq W1 \leq 0.8W2$ is satisfied. With this configuration, since the contact area between the first metal layer 231 and the base substrate 210 can be made smaller, the escape of heat to the base substrate 210 via the first metal layer 231 can be suppressed more effectively. Moreover, the width W1 of the first metal layer 231 can be prevented from excessively narrowing, so that a reduction in bonding strength between the lid 220 and the base substrate 210 can be suppressed. Therefore, laser sealing can be performed more reliably and efficiently, so that the airtightness of the accommodating space S can be more enhanced.

Further, since, by making the width of the first metal layer 231 smaller than the width of the second metal layer 232, portions of the second metal layer 232 protruding from the first metal layer 231 (in other words, both edges of the second metal layer 232 in its width direction) are brought into a state of floating from the base substrate 210, the portions become easy to bend (easy to deform). Due to the bending of the portions, stress applied in bonding of the lid 220 or residual stress after bonding can be absorbed or relieved. Therefore, the package 200 with higher reliability can be obtained.

Although not particularly limited and varying depending on the size of the package 200 or the like, the width W1 is preferably, for example, about from 120 μm to 220 μm. Moreover, although not particularly limited, the thickness of the first metal layer 231 is preferably about from 0.1 μm to 0.5 μm. With this configuration, the advantageous effects described above can be sufficiently provided, and an excessive increase in thickness can be suppressed. Therefore, residual stress of the first metal layer 231 can be held small.

Although the first metal layer 231 has been described so far, the first metal layer 231 is not limited to that composed of a single layer like the embodiment. For example, the first metal layer 231 may be composed of a stacked body in which a plurality of metal layers are stacked, such as obtained by stacking a metal layer composed of copper on a metal layer composed of chromium.

Moreover, a method of forming the first metal layer 231 is not particularly limited. For example, various kinds of vapor phase deposition methods such as sputtering or vapor deposition, various kinds of printing methods such as screen printing, and various kinds of plating processes such as an electrolytic plating process or an electroless plating process can be used.

Second Metal Layer

The second metal layer 232 is composed of a material whose thermal conductivity is higher than that of the constituent material of the first metal layer 231. With this configuration, in bonding of the lid 220 with the base substrate 210 by laser sealing, a region of the second metal layer 232 being irradiated with a laser can be heated and melted more uniformly and evenly. Therefore, the bonding of the lid 220 to the base substrate 210 can be performed reliably and evenly in the entire region of the metallization layer 230 in the circumferential direction, so that they can be bonded together more strongly. As a result, the airtightness of the accommodating space S can be more enhanced. Moreover, by performing the bonding evenly, stress (residual stress) generated in the package 200 can be more reduced, so that it is also possible to suppress a reduction in reliability of the piezoelectric element 300 accommodated in the inside.

Although not particularly limited, the thermal conductivity (thermal conductivity at a normal temperature (about 300K)) of the constituent material of the second metal layer 232 is preferably, for example, about 300 $W \cdot m^{-1} \cdot K^{-1}$ or more and more preferably about 400 $W \cdot m^{-1} \cdot K^{-1}$ or more. With this configuration, the advantageous effects described above can be provided more effectively.

The constituent material of the second metal layer 232 is not particularly limited as long as it is a material having the relatively high thermal conductivity as described above. For example, Au (gold), Ag (silver), Cu (copper), or an alloy containing at least one kind of them (containing as a main component) can be used preferably. These materials are preferable in terms that they have a higher thermal conductivity and further that they are easy to handle.

Moreover, although not particularly limited, the thickness of the second metal layer 232 is preferably about from 5 μm to 30 μm. With this configuration, the thickness of the second metal layer 232 can be made to be a thickness that is sufficient to provide its function. That is, for example, it is possible to prevent the second metal layer 232 from substantially disappearing due to melting and diffusion by laser irradiation, so that the lid 220 can be reliably bonded to the base substrate 210. Moreover, an excessive increase in thickness of the second metal layer 232 can be suppressed, so that residual stress of the second metal layer 232 can be held small.

Although the second metal layer 232 has been described so far, the second metal layer 232 is not limited to that composed of a single layer like the embodiment. For example, the second metal layer 232 may be composed of a stacked body in which a plurality of metal layers are stacked.

Moreover, a method of forming the second metal layer 232 is not particularly limited. For example, various kinds of vapor phase deposition methods such as sputtering or vapor deposition, various kinds of printing methods such as screen printing, and various kinds of plating processes such as an electrolytic plating process or an electroless plating process can be used.

Third Metal Layer

As described above, it is preferable that the third metal layer 233 mainly has a function of preventing the oxidation of the first and second metal layers 231 and 232 and a function of enhancing the wettability of the brazing material 225. With the functions described above, the bonding of the lid 220 to the base substrate 210 can be performed more reliably and strongly, and further evenly. It is preferable that the third metal layer 233 having the functions is composed of a material that is difficult to oxidize. Examples of the materials include, for example, Pt (platinum), Au (gold), Pd (palladium), or an alloy containing them. Moreover, among these, Au (gold) is preferably used from the viewpoints of difficulty in oxidation and the wettability of the brazing material 225.

The third metal layer 233 is formed so as to cover the entire surface regions of the first and second metal layers 231 and 232. With this configuration, the oxidation of the first and second metal layers 231 and 232 can be prevented more reliably.

Although not particularly limited, the thickness of the third metal layer 233 is preferably about from 0.05 μm to 0.4 μm. As described above, since the third metal layer 233 is a metal layer that is aimed at preventing the oxidation of the first and second metal layers 231 and 232 and improving the wettability of the brazing material 225, the functions can be sufficiently provided even when the third metal layer 233 is formed to be relatively thin as described above. Further, by forming the third metal layer 233 to have such a thickness, the third metal layer 233 melts, diffuses, and substantially disappears in laser sealing. Therefore, the second metal layer 232 and the brazing material 225 can be bonded (welded) together more reliably.

Although the third metal layer 233 has been described so far, the third metal layer 233 is not limited to that composed of a single layer like the embodiment. For example, the third metal layer 233 may be composed of a stacked body in which a plurality of metal layers are stacked, such as obtained by forming a metal layer having a thickness of 0.05 to 0.4 μm and composed of Au (gold) or Pd (palladium) on a metal layer having a thickness of 3 to 5 μm and composed of Ni (nickel). Moreover, it is sufficient that the third metal layer 233 is disposed as necessary. For example, when the second metal layer 232 is composed of a material that is difficult to oxidize, such as Au (gold), the second metal layer 232 may be omitted.

Moreover, a method of forming the third metal layer 233 is not particularly limited. For example, various kinds of vapor phase deposition methods such as sputtering or vapor deposition, various kinds of printing methods such as screen printing, and various kinds of plating processes such as an electrolytic plating process or an electroless plating process can be used.

The first to third metal layers 231 to 233 constituting the metallization layer 230 have been described in detail so far.

The metallization layer 230 of the embodiment is formed such that a width W3 thereof is greater than a width W4 of the opening edge surface of the lid 220. Further, the metallization layer 230 is formed such that in plan view of the package, the edge of the metallization layer 230 on the outer circumferential side protrudes from the periphery of the lid 220, in other words, the outer shape thereof in plan view is somewhat greater than the outer shape of the lid 220. With this configuration, even when the positioning of the lid 220 relative to the base substrate 210 is insufficient in bonding of the lid 220 to the base substrate 210, the lid 220 can be bonded to the base substrate 210 over the entire region of the metallization layer 230 in the circumferential direction, so that the accommodating space S can be airtightly sealed. Therefore, according to the configuration, a manufacturing yield can be improved.

As shown in FIG. 5, in addition to the metallization layer 230 described above, the pair of connection electrodes (electrodes) 241 and 242, the four mounting electrodes (electrodes) 251, 252, 253, and 254, and the pair of through-electrodes (electrodes) 261 and 262 are formed on and in the base substrate 210.

The connection electrodes 241 and 242 are formed inside the metallization layer 230 on the upper surface of the base substrate 210. Moreover, the mounting electrodes 251 to 254 are formed at four corners (corner portions) of a lower surface of the base substrate 210. The mounting electrode 251 of the mounting electrodes 251 to 254 is electrically connected with the connection electrode 241 via the through-electrode 261 penetrating the base substrate 210 in its thickness direction. The mounting electrode 252 located diagonally to the mounting electrode 251 is electrically connected with the connection electrode 242 via the through-electrode 262 penetrating the base substrate 210 in the thickness direction. The remaining two mounting electrodes 253 and 254 are not electrically connected with the connection electrodes 241 and 242 and function as dummy terminals for mounting.

Here, although the positions of the through-electrodes 261 and 262 are not particularly limited, it is preferable that the through-electrodes 261 and 262 are formed spaced as far apart as possible from the metallization layer 230. Although not particularly limited, a spaced apart distance between each of the through-electrodes 261 and 262 and the metallization layer 230 is preferably 100 μm or more and more preferably 150 μm or more. In this manner, each of the through-electrodes 261 and 262 is sufficiently spaced apart from the metallization layer 230, whereby it is possible to effectively suppress the escape of heat generated by laser irradiation via the through-electrodes 261 and 262. Therefore, the lid 220 can be bonded more efficiently to the base substrate 210.

Moreover, the connection electrodes 241 and 242 and the mounting electrodes 251 to 254 have the same configuration as that of the metallization layer 230 described above. That is, although not illustrated, the connection electrodes 241 and 242 and the mounting electrodes 251 to 254 are each composed of the stacked body in which the first metal layer (under layer), the second metal layer, and the third metal layer (covering layer) are stacked. By adopting the configuration described above, the connection electrodes 241 and 242 and the mounting electrodes 251 to 254 can be formed simultaneously with the metallization layer 230 by doing like the manufacturing method described later. Therefore, the manufacture of the electronic device 100 can be simplified. Moreover, by forming the connection electrodes 241 and 242 simultaneously with the metallization layer 230, the height of the connection electrodes 241 and 242 can coincide with the height of the metallization layer 230. Therefore, for example, the height of the piezoelectric element 300 (a spaced apart distance from the base substrate 210) in the accommodating space S can be easily managed, so that it is possible to easily prevent the piezoelectric element 300 from contacting the upper surface of the base substrate 210 or an inner surface of the lid 220 in the accommodating space S.

In the accommodating space S of the package 200 described above, the piezoelectric element 300 described above is accommodated. Moreover, the piezoelectric element 300 is supported in a cantilever fashion by the base substrate 210 via the pair of electrically-conductive adhesives 291 and 292. The electrically-conductive adhesive 291 is disposed in contact with the connection electrode 241 and the bonding pad 322. With this configuration, the connection electrode 241 and the bonding pad 322 are electrically connected via the electrically-conductive adhesive 291. Similarly, the electrically-conductive adhesive 292 is disposed in contact with the connection electrode 242 and the bonding pad 332. With this configuration, the connection electrode 242 and the bonding pad 332 are electrically connected via the electrically-conductive adhesive 292.

The electrically-conductive adhesives 291 and 292 are not particularly limited as long as they can fix the piezoelectric element 300 to the base substrate 210 and have electrical conductivity. For example, a silver paste (for example, one obtained by dispersing silver particles in an epoxy resin-based adhesive), a copper paste, or the like can be preferably used. Among these, a silver paste is preferably used from the viewpoints of oxidation resistance and low resistance.

The configuration of the electronic device 100 has been described in detail so far. According to the electronic device 100, in a reflow soldering step or the like for example, a solder can be prevented from melting more than necessary due to heat transferred from the lid 220 to a mounting portion (substrate or the like for mounting the electronic device 100 thereon) in heating in a furnace. Alternatively, in a flow soldering step or the like, a bonding portion between the lid 220 and the base substrate 210 can be prevented from partially melting due to heat of a solder transferred to the bonding portion.

In the above, as a method of bonding the lid 220 with the base substrate 210, the method using laser irradiation has been described by way of example. However, the bonding method is not limited to this. For example, seam welding, or a method of irradiation with an electron beam or an infrared ray may be used. Also in this case, advantageous effects similar to those described above can be provided.

2. Method of Manufacturing Electronic Device

Next, a method of manufacturing the electronic device 100 will be described.

The method of manufacturing the electronic device 100 has a first step and a second step. In the first step, the lid 220 and the base substrate 210 formed with the metallization layer 230, the connection electrodes 241 and 242, the mounting electrodes 251 and 252, and the through-electrodes 261 and 262 are prepared. In the second step, the lid 220 and the base substrate 210 are bonded together by irradiation with a laser (energy beam).

First Step

Figure 6A:
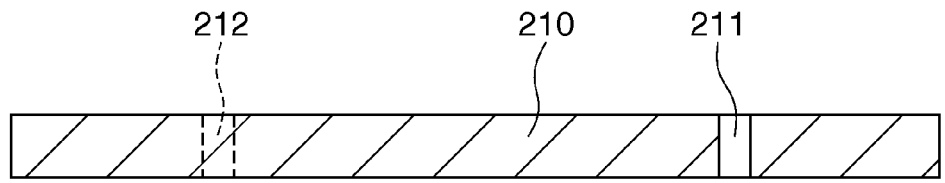
FIGS. 6A to 6D explain a method of manufacturing the electronic device shown in FIG. 1.

First, as shown in FIG. 6A, the plate-like base substrate 210 having through-holes 211 and 212 is prepared. The base substrate 210 is obtained by forming a mixture of a raw material powder having ceramics or glass, an organic solvent, and a binder in a sheet shape by a doctor blade method or the like to obtain a ceramic green sheet, baking the obtained ceramic green sheet, and then forming the through-holes 211 and 212 by laser irradiation or the like. In this case, it is preferable that the ceramic green sheet is a single layer. With this configuration, a reduction in manufacturing cost can be achieved. Moreover, bending or warp of the base substrate 210 can be suppressed.

Figure 6B:
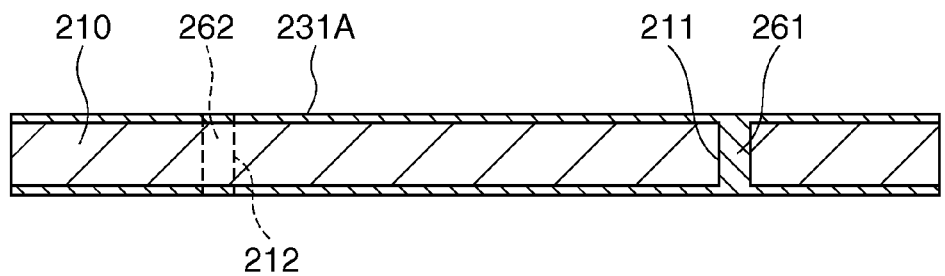

Next, as shown in FIG. 6B, a metal layer 231A composed of chromium (Cr) is formed on the upper and lower surfaces of the base substrate 210 by, for example, sputtering. In this case, the metal layer 231A is formed (filled) on side surfaces in the through-holes 211 and 212, and thus the through-electrodes 261 and 262 are formed. For example, when the aspect ratio of the through-holes 211 and 212 is large (elongated), a metal material may be previously buried in the through-holes 211 and 212 before forming the metal layer 231A.

Figure 6C:
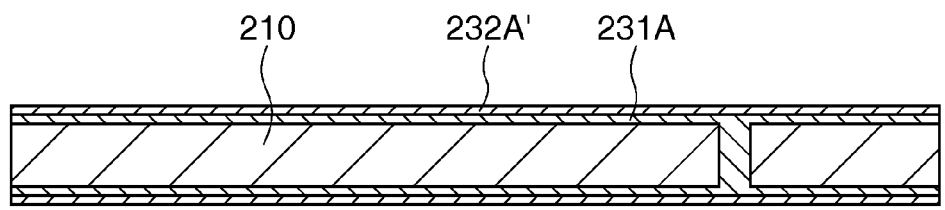

Next, as shown in FIG. 6C, a metal layer 232A' composed of copper (Cu) is formed on the metal layer 231A by, for example, sputtering.

Figure 6D:
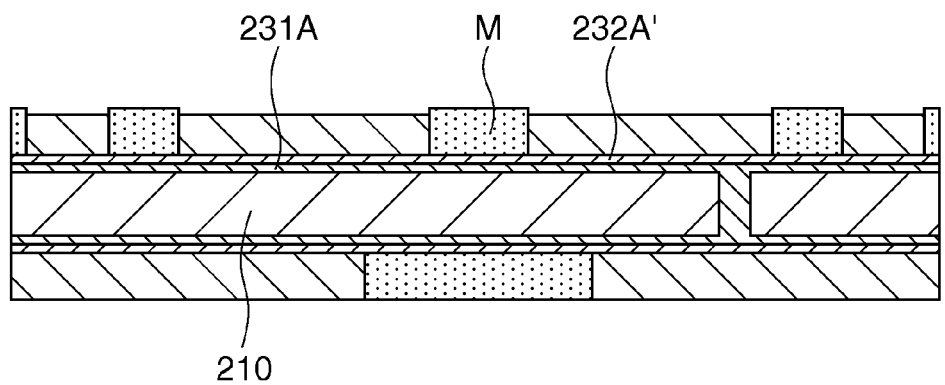

Next, as shown in FIG. 6D, a mask M corresponding to the shapes of the metallization layer 230, the connection electrodes 241 and 242, and the mounting electrodes 251 and 252 is formed on the metal layer 232A' using a photolithographic method. Next, plating is applied by an electrolytic copper plating process to thereby form a metal layer 232A" on portions of the metal layer 232A' exposed from the mask M (that is, portions corresponding to the metallization layer 230, the connection electrodes 241 and 242, and the mounting electrodes 251 and 252). In this case, copper plating is filled in the through-holes 211 and 212, so that the through-electrodes 261 and 262 are formed.

Figure 7A:
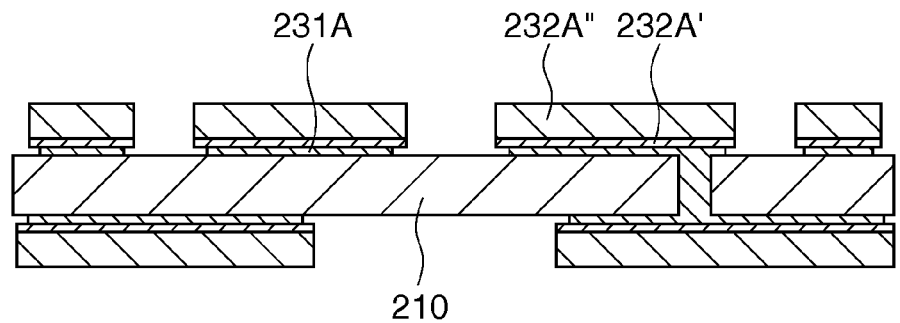
FIGS. 7A to 7C explain the method of manufacturing the electronic device shown in FIG. 1.

Next, as shown in FIG. 7A, after removing the mask M, the metal layer 232A' is patterned by wet etching using the metal layer 232A" as a mask. In this case, since the metal layers 232A' and 232A" are composed of the same material (Cu), the metal layer 232A" as a mask is also etched simultaneously with the metal layers 232A' and 231A, so that the thickness of the metal layer 232A" is somewhat reduced. Therefore, it is preferable that the metal layer 232A" is formed to have a thickness that can withstand etching and formed to be somewhat thicker than a design value in expectation of a reduction in thickness due to etching. According to the electrolytic copper plating process described above, the metal layer 232A" having a relatively large thickness can be easily formed compared to other methods.

Next, the metal layer 231A' is patterned by wet etching using the metal layers 232A' and 232A" as masks. In this case, as shown in FIG. 7A, both edges of the metal layer 231A in its width direction are removed by side etching, whereby the width of the metal layer 231A is smaller than the width of the metal layer 232A'.

Figure 7B:
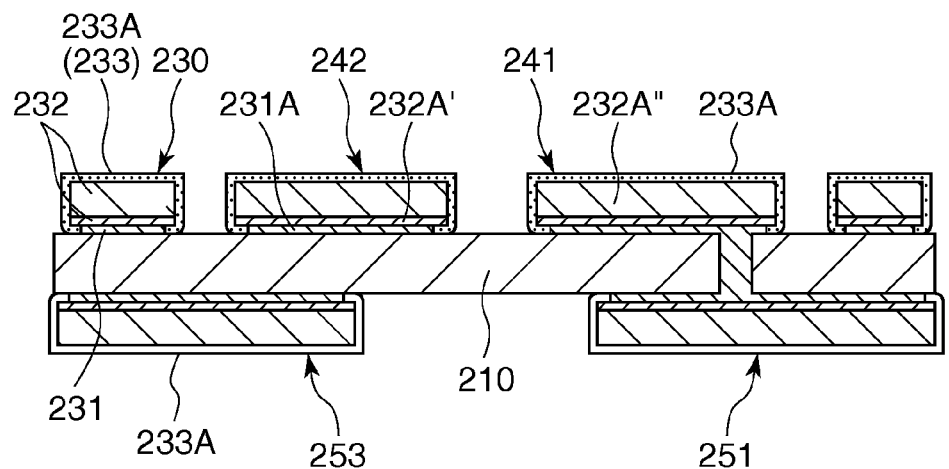

Next, as shown in FIG. 7B, plating is applied by sequentially performing an electroless nickel plating process and an electroless gold plating process to thereby form a metal layer 233A on the metal layer 232A". With the use of an electroless plating process, the metal layer 233A can be formed so as to cover the entire regions of the metal layers 231A, 232A', and 232A".

Through the step described above, the base substrate formed with the metallization layer 230, the connection electrodes 241 and 242, the mounting electrodes 251 and 252, and the through-electrodes 261 and 262 is obtained. According to the method of manufacturing the base substrate 210 (the manufacturing method of the embodiment of the invention), since the metallization layer 230, the connection electrodes 241 and 242, the mounting electrodes 251 and 252, and the through-electrodes 261 and 262 can be formed simultaneously (in the same step), the base substrate 210 can be easily manufactured.

In the metallization layer 230, the metal layer 231A constitutes the first metal layer 231, the metal layers 232A' and 232A" constitute the second metal layer 232, and the metal layer 233A constitutes the third metal layer 233. Especially, as described above, the entire surface regions of the first metal layer 231 and the second metal layer 232 can be covered with the third metal layer 233 by forming the third metal layer 233 by an electroless plating process. Therefore, the oxidation of the first and second metal layers 231 and 232 can be prevented more effectively. Moreover, with the use of side etching in wet etching, the width of the first metal layer 231 can be easily and reliably made smaller than the width of the second metal layer 232.

The base substrate 210 is prepared in this manner, and the lid 220 formed with the brazing material 225 is prepared.
Second Step Next, the piezoelectric element 300 is fixed to the base substrate 210 via the electrically-conductive adhesives 291 and 292. With this configuration, the bonding pads 322 and 332 and the connection electrodes 241 and 242 are electrically connected via the electrically-conductive adhesives 291 and 292.

Figure 7C:
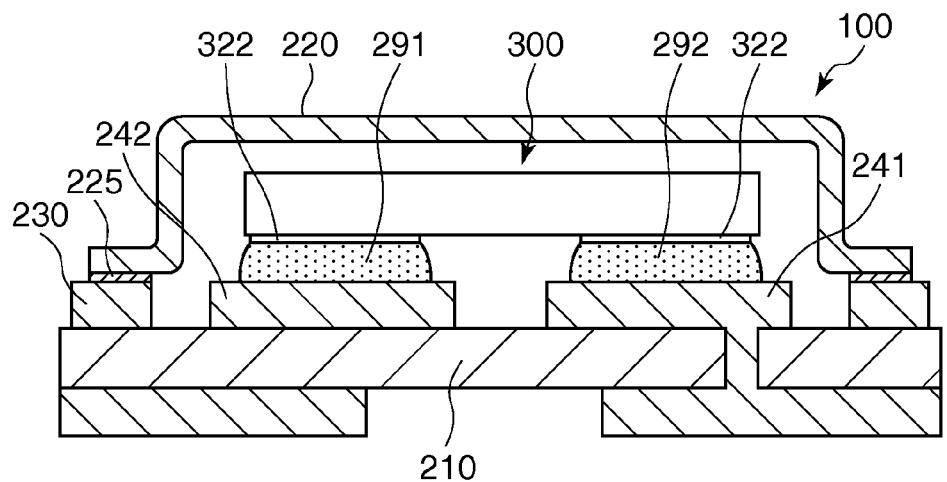

Next, for example, under a reduced-pressure (preferably a vacuum) environment or under an inert gas environment such as nitrogen, the lid 220 is placed above the base substrate 210 via the brazing material 225 as shown in FIG. 7C. It is preferable that the brazing material 225 is previously formed on the lower surface (opening edge surface) of the lid 220. With this configuration, the placing of the lid 220 becomes easy. Next, the brazing material 225 is irradiated with a laser from the lid 220 side to melt the brazing material 225 and the metallization layer 230, whereby the lid 220 is bonded to the base substrate 210. With this configuration, the electronic device 100 whose inside (the accommodating space S) is airtightly sealed is obtained.

According to the method described above, since the metallization layer 230 is not connected to any of the mounting electrodes 251 to 254 and formed independently on the upper surface of the base substrate 210, the escape of heat can be effectively suppressed, and thus the metallization layer 230 and the brazing material 225 can be efficiently heated with a laser. Therefore, compared to the related art for example, the intensity of a laser can be lowered or the irradiation time of a laser can be shortened, so that damage done to the brazing material 225 or the metallization layer 230 can be reduced. Hence, for example, the peeling of the metallization layer 230 from the base substrate 210, or the like, can be prevented more effectively, so that the bonding of the lid 220 with the base substrate 210 can be performed more reliably, and the airtightness of the accommodating space S is improved.

Especially, in the embodiment, since the width of the first metal layer 231 is made smaller than the width of the second metal layer 232, the escape of heat from the metallization layer 230 to the base substrate 210 can be suppressed more effectively, so that the above advantageous effects can be provided more remarkably.

Second Embodiment

Next, a second embodiment of an electronic device of the embodiment of the invention will be described.

Figure 8:
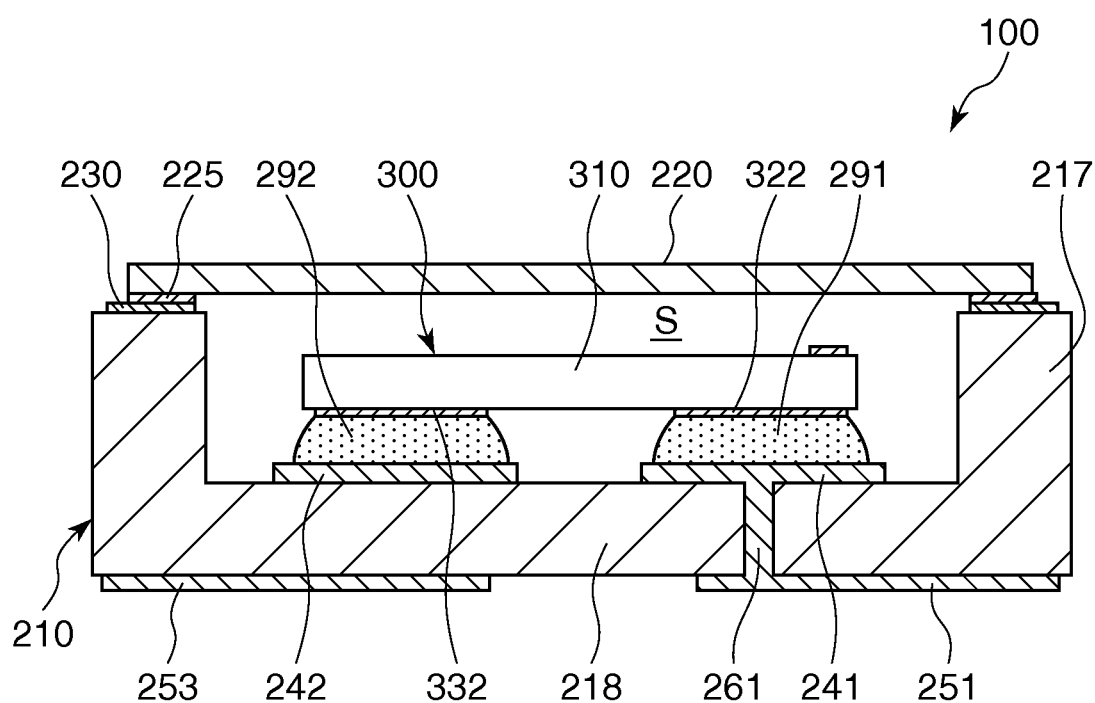
FIG. 8 is a cross-sectional view of an electronic device according to a second embodiment of the invention.

FIG. 8 is a cross-sectional view of the electronic device according to the second embodiment of the invention.

Hereinafter, the electronic device of the second embodiment will be described mainly on differences from the embodiment described above, and the description of similar matters is omitted.

The electronic device of the second embodiment of the invention is similar to that of the first embodiment described above excepting that the configuration of the package, specifically, the shapes of the base substrate and the lid are different. Configurations similar to those of the embodiment described above are denoted by the same reference signs and numerals.

In the electronic device 100 shown in FIG. 8, the base substrate 210 is of a cavity type in which a recess that is opened in the upper surface is provided, and the lid 220 has a plate shape. Then, the lid 220 is bonded on the upper surface (opening edge surface) of the base substrate 210 so as to cover an opening of the recess of the base substrate 210.

The base substrate 210 has a plate-like bottom portion 218 and a frame-like side wall 217 erected from the periphery of the bottom portion. Then, the connection electrodes 241 and 242, the mounting electrodes 251 to 254, and the through-electrodes 261 and 262 are formed on and in the bottom portion 218, and the metallization layer 230 is formed on an upper surface (opening edge surface of the recess) of the side wall 217.

Also according to the second embodiment, advantageous effects similar to those of the first embodiment described above can be provided.

Electronic Apparatuses

Next, electronic apparatuses to which the electronic device of the embodiment of the invention is applied will be described in detail based on FIGS. 9 to 11.

Figure 9:
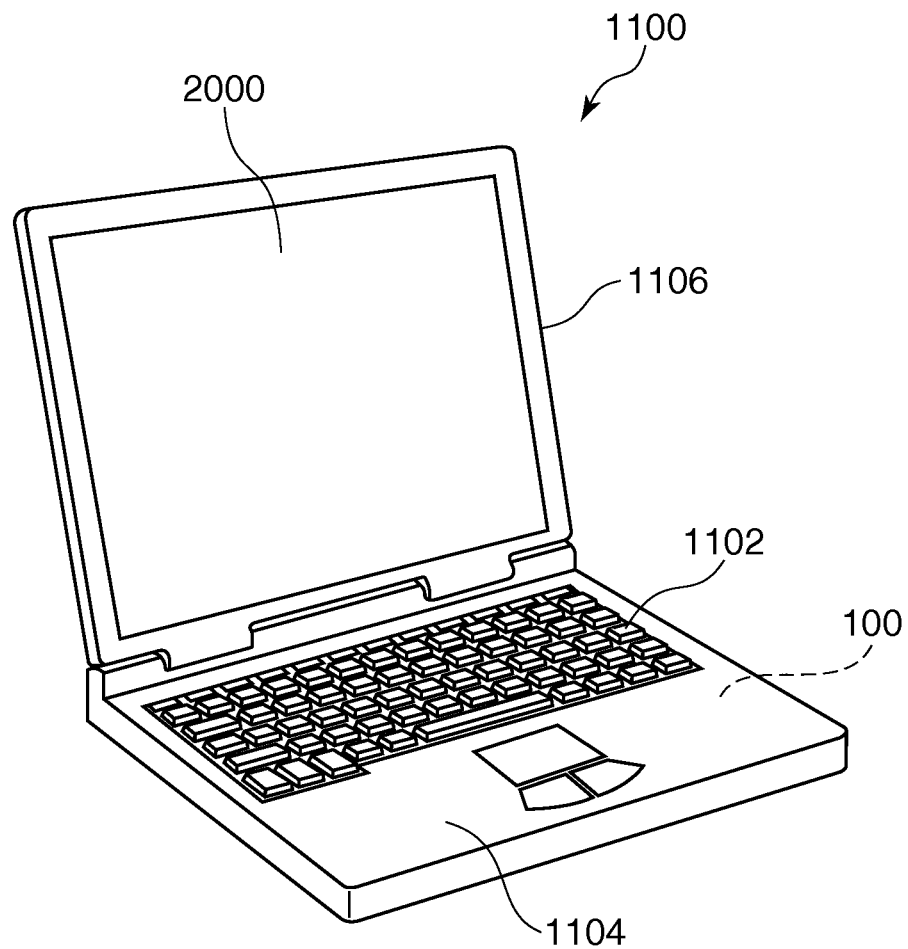
FIG. 9 is a perspective view showing the configuration of a mobile (or notebook) personal computer to which an electronic apparatus including the electronic device of the embodiment of the invention is applied.

FIG. 9 is a perspective view showing the configuration of a mobile (or notebook) personal computer to which an electronic apparatus including the electronic device of the embodiment of the invention is applied. In the drawing, the personal computer 1100 includes a main body portion 1104 including a keyboard 1102 and a display unit 1106 having a display portion 2000. The display unit 1106 is rotationally movably supported relative to the main body portion 1104 via a hinge structure portion. In the personal computer 1100, the electronic device 100 functioning as a filter, a resonator, a reference clock, or the like is incorporated.

Figure 10:
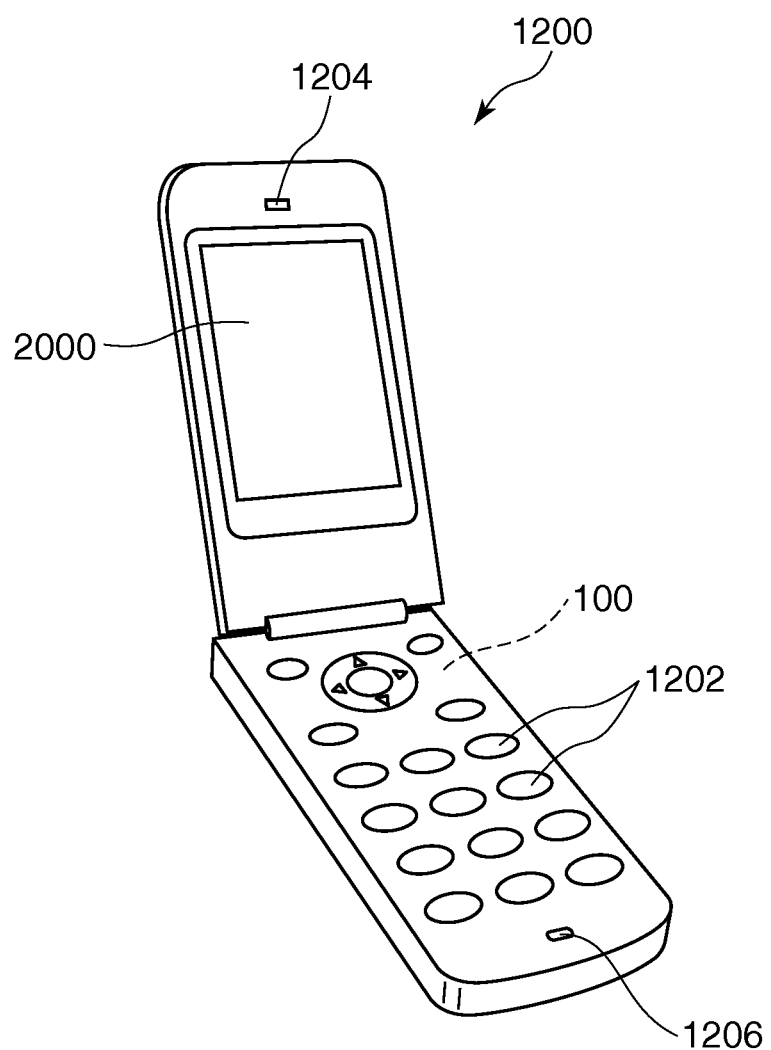
FIG. 10 is a perspective view showing the configuration of a mobile phone (including a PHS) to which an electronic apparatus including the electronic device of the embodiment of the invention is applied.

FIG. 10 is a perspective view showing the configuration of a mobile phone (including a PHS) to which an electronic apparatus including the electronic device of the embodiment of the invention is applied. In the drawing, the mobile phone 1200 includes a plurality of operation buttons 1202, an earpiece 1204, and a mouthpiece 1206. A display portion 2000 is arranged between the operation buttons 1202 and the earpiece 1204. In the mobile phone 1200, the electronic device 100 functioning as a filter, a resonator, or the like is incorporated.

Figure 11:
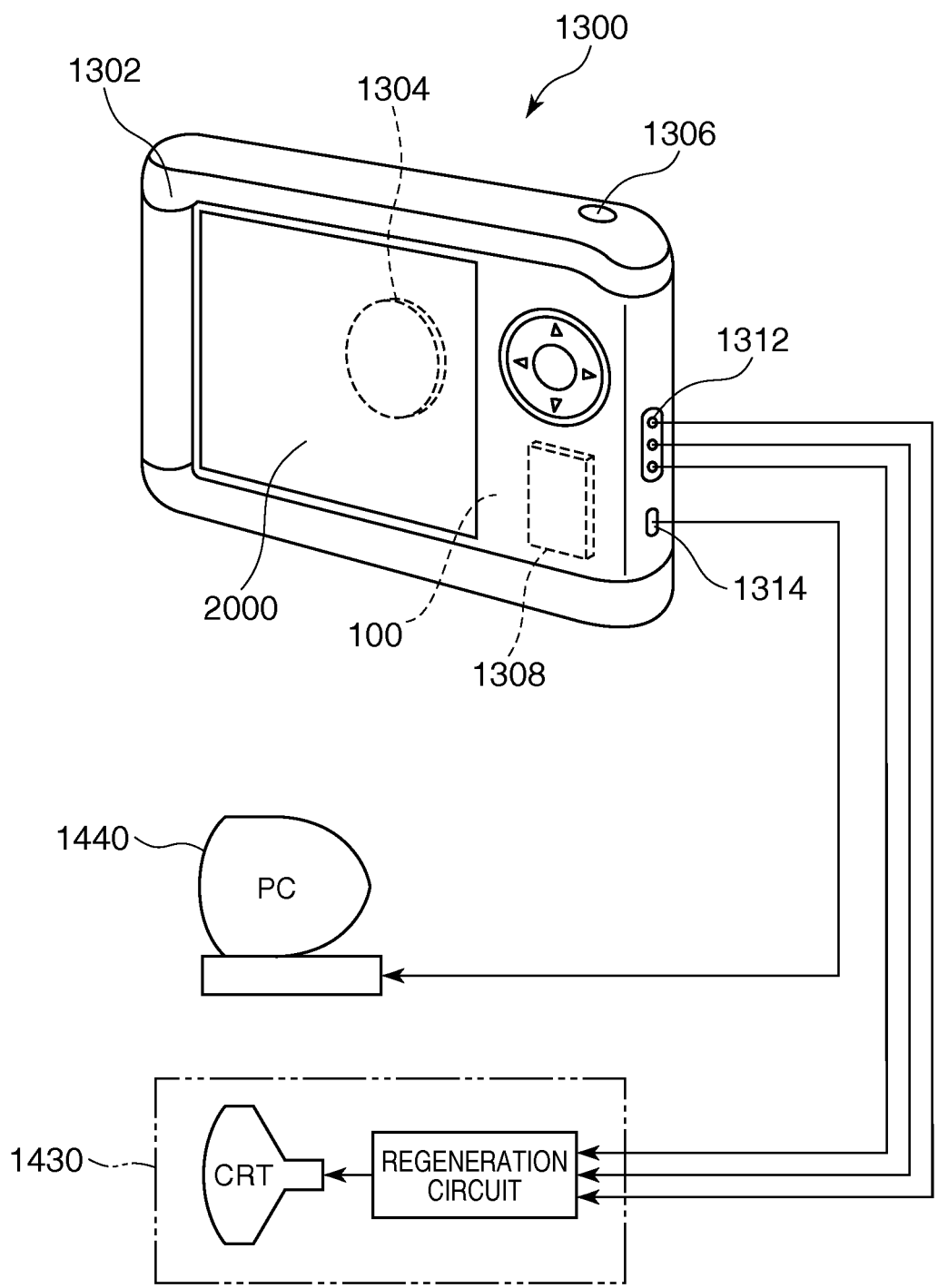
FIG. 11 is a perspective view showing the configuration of a digital still camera to which an electronic apparatus including the electronic device of the embodiment of the invention is applied.

FIG. 11 is a perspective view showing the configuration of a digital still camera to which an electronic apparatus including the electronic device of the embodiment of the invention is applied. In the drawing, connections with external apparatuses are also shown in a simplified manner. Here, usual cameras expose a silver halide photographic film with an optical image of a subject, whereas the digital still camera 1300 photoelectrically converts an optical image of a subject with an imaging element such as a CCD (Charge Coupled Device) to generate imaging signals (image signals).

A display portion is disposed on the back surface of a case (body) 1302 in the digital still camera 1300 and configured to perform display based on imaging signals generated by a CCD. The display portion functions as a finder that displays a subject as an electronic image. Moreover, on the front side (the rear side in the drawing) of the case 1302, alight receiving unit 1304 including an optical lens (imaging optical system) and a CCD is disposed.

When a photographer confirms a subject image displayed on the display portion and presses down a shutter button 1306, imaging signals of a CCD at the time are transferred to and stored in a memory 1308. Moreover, in the digital still camera 1300, a video signal output terminal 1312 and a data communication input/output terminal 1314 are disposed on the side surface of the case 1302. Then, as shown in the drawing, a television monitor 1430 and a personal computer 1440 are connected as necessary to the video signal output terminal 1312 and the data communication input/output terminal 1314, respectively. Further, the imaging signals stored in the memory 1308 are output to the television monitor 1430 or the personal computer 1440 by a predetermined operation. In the digital still camera 1300, the electronic device 100 functioning as a filter, a resonator, or the like is incorporated.

An electronic apparatus including the electronic device of the embodiment of the invention can be applied to for example, in addition to the personal computer (mobile personal computer) shown in FIG. 9, the mobile phone shown in FIG. 10, and the digital still camera shown in FIG. 11, inkjet ejection apparatuses (for example, inkjet printers), laptop personal computers, television sets, video camcorders, video tape recorders, various kinds of navigation systems, pagers, electronic notebooks (including those with communication function), electronic dictionaries, calculators, electronic gaming machines, word processors, workstations, videophones, surveillance television monitors, electronic binoculars, POS terminals, medical equipment (for example, electronic thermometers, sphygmomanometers, blood glucose meters, electrocardiogram measuring systems, ultrasonic diagnosis apparatuses, and electronic endoscopes), fishfinders, various kinds of measuring instrument, indicators (for example, indicators used in vehicles, aircraft, and ships), flight simulators, and the like.

Although the electronic device, the electronic apparatus, the method of manufacturing the base substrate, and the method of manufacturing the electronic device of the invention have been described so far based on the illustrated embodiments, the invention is not limited to them. The configuration of each of the portions can be replaced with any configuration having a similar function. Moreover, any other constituent may be added to the invention. Moreover, each of the embodiments may be appropriately combined.

The entire disclosure of Japanese Patent Application No. 2012-089664, filed Apr. 10, 2012 is expressly incorporated by reference herein.

What is claimed is:

1. An electronic device comprising:
an electronic component;
a base substrate to which the electronic component is fixed;
a lid portion accommodating the electronic component in a space arranged together with the base substrate;
a frame-like metallization layer arranged above the base substrate and bonding the base substrate and the lid portion together; and
an electrode arranged above the base substrate,
wherein the metallization layer and the electrode are insulated from each other,
the metallization layer has a plurality of metal layers including a first metal layer, a second metal layer, and a third metal layer stacked above the base substrate,
the first metal layer has a thermal conductivity that is less than or equal to 50% of a thermal conductivity of the second metal layer,
in plan view, a width of the first metal layer that is located closest to the base substrate side is smaller than a width of at least one of the remaining plurality of metal layers,
the second metal layer is sandwiched by the first and third metal layers;
the third metal layer directly contacts each of the first and second metal layers,
end portions of the third metal layer face and directly contact the base substrate,
a portion of the third metal layer is located between the second metal layer and the base substrate, and
wherein the first metal layer is a Ni—Cr-based alloy.

2. The electronic device according to claim 1, wherein at least one of the plurality of metal layers includes a material containing as a main component one of gold, silver, and copper.

3. The electronic device according to claim 1, wherein
the electrode has a through-electrode penetrating the base substrate and spaced apart from the metallization layer by at least 150 μm.

4. An electronic apparatus comprising:
a casing; and
the electronic device according to claim 1 positioned within the casing.

5. A method of manufacturing a base substrate including an electrode formed on one of surfaces, an electrode formed on the other surface and electrically connected with the electrode on the one surface, and a metallization layer formed on the one surface and arranged so as to be insulated from the electrode on the one surface and surround the electrode on the one surface, the method comprising:
simultaneously forming the electrode on the one surface and the metallization layer by plating,
wherein the metallization layer has a plurality of metal layers including a first metal layer, a second metal layer, and a third metal layer stacked above the base substrate,
the first metal layer has a thermal conductivity that is less than or equal to 50% of a thermal conductivity of the second metal layer,
in plan view, a width of one of the first metal layer that is located closest to the base substrate side is smaller than a width of at least one of the remaining plurality of metal layers,
the second metal layer is sandwiched between the first and third metal layers,
the third metal layer directly contacts each of the first and second metal layers,
end portions of the third metal layer face and directly contact the base substrate,
a portion of the third metal layer is located between the second metal layer and the base substrate, and
wherein the first metal layer is a Ni—Cr-based alloy.

6. A method of manufacturing an electronic device, comprising:
preparing a lid made of a metal and a base substrate including an electrode formed on one of surfaces, an electrode formed on the other surface and electrically connected with the electrode on the one surface, and a metallization layer formed on the one surface and arranged so as to be insulated from the electrode on the one surface and surround the electrode on the one surface,
wherein the metallization layer has a plurality of metal layers including a first metal layer, a second metal layer, and a third metal layer stacked above the base substrate,
the first metal layer has a thermal conductivity that is less than or equal to 50% of a thermal conductivity of the second metal layer,
in plan view, a width of one of the first metal layer that is located closest to the base substrate side is smaller than a width of at least one of the remaining plurality of metal layers,
the second metal layer is sandwiched between the first and third metal layers,
the third metal layer directly contacts each of the first and second metal layers,
end portions of the third metal layer face and directly contact the base substrate, and
a portion of the third metal layer is located between the second metal layer and the base substrate; and
bonding the lid and the base substrate together by irradiation with an energy beam,
wherein the first metal layer is a Ni—Cr-based alloy.

* * * * *